US012693351B2

(12) United States Patent
Terao et al.

(10) Patent No.: US 12,693,351 B2
(45) Date of Patent: Jul. 28, 2026

(54) BATTERY IDENTIFICATION SYSTEM, BATTERY IDENTIFICATION METHOD, AND NON-TRANSITORY COMPUTER READABLE MEDIUM

(71) Applicants: Yokogawa Electric Corporation, Musashino (JP); HONDA MOTOR CO., LTD., Tokyo (JP)

(72) Inventors: Minako Terao, Musashino (JP); Kazuma Takenaka, Musashino (JP); Naoki Noguchi, Musashino (JP); Satoshi Yoshitake, Musashino (JP); Jun Okano, Wako (JP); Yuki Tominaga, Wako (JP); Kaoru Omichi, Wako (JP); Yukiko Onoue, Wako (JP)

(73) Assignees: Yokogawa Electric Corporation, Tokyo (JP); HONDA MOTOR CO., LTD., Tokyo (JP)

( * ) Notice: Subject to any disclaimer, the term of this patent is extended or adjusted under 35 U.S.C. 154(b) by 152 days.

(21) Appl. No.: 18/627,532

(22) Filed: Apr. 5, 2024

(65) Prior Publication Data

US 2024/0337711 A1 Oct. 10, 2024

(30) Foreign Application Priority Data

Apr. 6, 2023 (JP) ................................. 2023-062352

(51) Int. Cl.
*G01R 33/10* (2006.01)
(52) U.S. Cl.
CPC .................................... *G01R 33/10* (2013.01)
(58) Field of Classification Search
CPC .... G01R 33/10; G01R 31/385; G01R 31/367; G01R 31/378; H01M 10/4285; H01M 10/482; Y02E 60/10; G06F 18/2415
See application file for complete search history.

(56) References Cited

U.S. PATENT DOCUMENTS 5,111,128 A * 5/1992 Branan, Jr. ........... H01M 10/48
429/7
5,164,652 A * 11/1992 Johnson .............. H02J 7/00047
455/226.1

(Continued)

FOREIGN PATENT DOCUMENTS

JP          H11-8942 A      1/1999
JP          2020-169932 A   10/2020
JP          2020-187951 A   11/2020

OTHER PUBLICATIONS

Extended European Search Report dated Sep. 10, 2024, issued in counterpart Application No. 24168487.7. (6 pages).

(Continued)

*Primary Examiner* — Vinh P Nguyen
(74) *Attorney, Agent, or Firm* — WHDA, LLP

(57) ABSTRACT

A battery identification system includes a sensor having a sensing surface and a plurality of magnetic elements arranged in or on the sensing surface, a meter configured to measure, using the plurality of magnetic elements, a magnetic field distribution on an outer surface of a battery with the sensing surface facing the outer surface of the battery, which includes a plurality of battery cells electrically connected to each other, and a computer configured to identify the type of the battery by comparing the magnetic field distribution measured by the meter with a reference magnetic field distribution, with reference to reference data indicating the reference magnetic field distribution, and output information regarding the identified type of the battery, as battery information.

14 Claims, 8 Drawing Sheets

(56)　　　　　References Cited

U.S. PATENT DOCUMENTS

| | | | |
|---|---|---|---|
| 5,565,956 A * | 10/1996 | Kusaka | G02B 7/346 |
| | | | 396/114 |
| 7,847,515 B2 | 12/2010 | Schroeck et al. | |
| 8,686,693 B2 * | 4/2014 | Bhowmik | H02J 7/52 |
| | | | 320/152 |
| 9,910,099 B2 * | 3/2018 | Okada | G01R 31/374 |
| 11,125,707 B1 * | 9/2021 | Fasching | G01R 31/392 |
| 12,061,238 B2 * | 8/2024 | Okano | G01R 31/385 |
| 2020/0365952 A1 | 11/2020 | Nagano | |

OTHER PUBLICATIONS

Office Action dated May 12, 2026, issued in counterpart JP Application No. 2023-062352, with English translation. (8 pages).

* cited by examiner

*FIG. 6*

BATTERY IDENTIFICATION SYSTEM, BATTERY IDENTIFICATION METHOD, AND NON-TRANSITORY COMPUTER READABLE MEDIUM

CROSS-REFERENCE TO RELATED APPLICATION

This application claims priority to Japanese Patent Application No. 2023-062352, filed on Apr. 6, 2023, the entire contents of which are incorporated herein by reference.

TECHNICAL FIELD

The present disclosure relates to a battery identification system, a battery identification method, and a non-transitory computer readable medium.

BACKGROUND

Patent Literature (PTL) 1 discloses an inspection apparatus that obtains a current distribution of a battery by measuring magnetism when an electric current is applied to the battery, and determines whether the battery is normal or abnormal according to whether the current distribution is normal. Patent Literature (PTL) 2 discloses a battery diagnostic system that calculates a plurality of degradation parameters of a battery, determines that the battery is a genuine product when all of the degradation parameters are within standard ranges, and determines that the battery is a non-genuine product when at least one of the degradation parameters is outside the standard range.

CITATION LIST

Patent Literature

PTL 1: JP 2020-187951 A
PTL 2: JP 2020-169932 A

SUMMARY

A battery identification system according to some embodiments includes:
  a sensor having a sensing surface and a plurality of magnetic elements arranged in or on the sensing surface;
  a meter configured to measure, using the plurality of magnetic elements, a magnetic field distribution on an outer surface of a battery with the sensing surface facing the outer surface of the battery, which includes a plurality of battery cells electrically connected to each other; and
  a computer configured to identify the type of the battery by comparing the magnetic field distribution measured by the meter with a reference magnetic field distribution, with reference to reference data indicating the reference magnetic field distribution, and output information regarding the identified type of the battery, as battery information.
A battery identification method according to some embodiments includes:
  measuring, by a meter, a magnetic field distribution on an outer surface of a battery, using a plurality of magnetic elements arranged in or on a sensing surface of a sensor, with the sensing surface facing the outer surface of the battery, which includes a plurality of battery cells electrically connected to each other;
  identifying, by a computer, the type of the battery by comparing the magnetic field distribution measured by the meter with a reference magnetic field distribution, with reference to reference data indicating the reference magnetic field distribution; and
  outputting, from the computer, information regarding the identified type of the battery, as battery information.
A program stored in a non-transitory computer readable medium according to some embodiments causes a computer to execute operations, the operations including:
  acquiring measurement data that indicates a magnetic field distribution on an outer surface of a battery, the magnetic field distribution being measured using a plurality of magnetic elements arranged in or on a sensing surface of a sensor with the sensing surface facing the outer surface of the battery, which includes a plurality of battery cells electrically connected to each other;
  identifying the type of the battery by comparing the magnetic field distribution on the outer surface with a reference magnetic field distribution, with reference to reference data indicating the reference magnetic field distribution; and
  outputting information regarding the identified type of the battery, as battery information.

BRIEF DESCRIPTION OF THE DRAWINGS

In the accompanying drawings:
FIG. 6 is a graph illustrating an example of conversion of a magnetic field distribution measured by a meter according to the embodiment of the present disclosure into a function.

DETAILED DESCRIPTION

Figure 1:
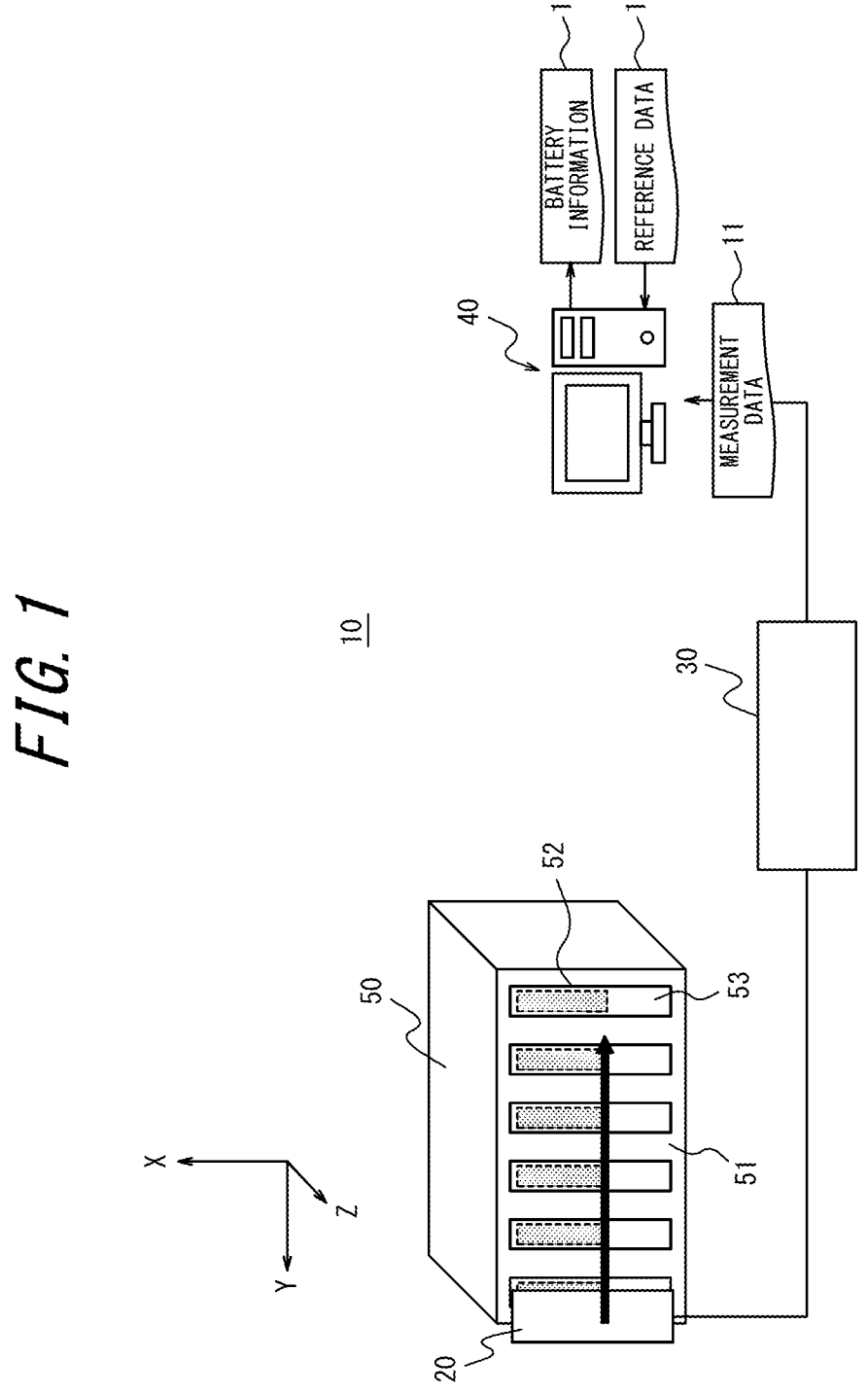
FIG. 1 is a diagram illustrating a configuration of a battery identification system according to an embodiment of the present disclosure.

The inspection apparatus disclosed in PTL 1 is designed to detect a short circuit inside a battery and cannot determine the authenticity of the battery. The battery diagnostic system disclosed in PTL 2 determines the authenticity of a battery based on degradation parameters of the battery. However, even in genuine products, a state or process of degradation differs from battery to battery and depending on elapsed time, so there is a risk of erroneous determination.

It would be helpful to improve accuracy in identifying the type of a battery.

A battery identification system, a battery identification method, and a non-transitory computer readable medium according to some embodiments will be described below.

[1]

A battery identification system including:

a sensor having a sensing surface and a plurality of magnetic elements arranged in or on the sensing surface;

a meter configured to measure, using the plurality of magnetic elements, a magnetic field distribution on an outer surface of a battery with the sensing surface facing the outer surface of the battery, which includes a plurality of battery cells electrically connected to each other; and a computer configured to identify the type of the battery by comparing the magnetic field distribution measured by the meter with a reference magnetic field distribution, with reference to reference data indicating the reference magnetic field distribution, and output information regarding the identified type of the battery, as battery information.

In such a battery identification system, the type of the battery is identified by physical characteristics that are hard to change since the time of manufacture, thus improving accuracy in identifying the type of the battery.

[2]

The battery identification system according to [1], wherein the meter is configured to measure the magnetic field distribution on the outer surface with the sensing surface facing the outer surface so that the plurality of magnetic elements is aligned along an end surface of at least one battery cell of the plurality of battery cells.

In such a battery identification system, the magnetic field distribution at the end surface of the battery cell, which is easily characterized, is measured, thus further improving accuracy in identifying the type of the battery.

[3]

The battery identification system according to [1], wherein the meter is configured to measure the magnetic field distribution on the outer surface with the sensing surface facing the outer surface so that the plurality of magnetic elements is aligned across end surfaces of two or more battery cells of the plurality of battery cells.

In such a battery identification system, the magnetic field distribution at the end surfaces of the battery cells, which is easily characterized, is measured, thus further improving accuracy in identifying the type of the battery.

[4]

The battery identification system according to [3], wherein the meter is configured to measure the magnetic field distribution on the outer surface with the sensing surface facing the outer surface so that the plurality of magnetic elements is aligned along an end surface of each of the two or more battery cells.

In such a battery identification system, a wide range of magnetic field distribution is measured, thus further improving accuracy in identifying the type of the battery.

[5]

The battery identification system according to any one of [1] to [4], wherein the sensor is configured to be secured to the battery when the meter measures the magnetic field distribution on the outer surface.

In such a battery identification system, the magnetic field distribution can be measured in a short time.

[6]

The battery identification system according to any one of [1] to [4], wherein the sensor is configured to be moved along a direction in which the plurality of battery cells is aligned when the meter measures the magnetic field distribution on the outer surface.

In such a battery identification system, a wide range of magnetic field distribution can be measured using a small number of magnetic elements.

[7]

The battery identification system according to any one of [1] to [4], wherein the sensor is configured to be moved along a direction orthogonal to a direction in which the plurality of battery cells is aligned when the meter measures the magnetic field distribution on the outer surface.

In such a battery identification system, a wide range of magnetic field distribution can be measured using a small number of magnetic elements.

[8]

The battery identification system according to any one of [1] to [7], wherein the computer is configured to compare the magnetic field distribution measured by the meter with the reference magnetic field distribution, after weighting each magnetic field measurement value included in the magnetic field distribution measured by the meter according to a position at which the each magnetic field measurement value is measured.

In such a battery identification system, the magnetic field distribution with enhanced characteristics can be obtained, thus further improving accuracy in identifying the type of the battery.

[9]

The battery identification system according to any one of [1] to [8], wherein the reference data is data that indicates the reference magnetic field distribution as a function, and the computer is configured to compare the magnetic field distribution measured by the meter with the reference magnetic field distribution, after converting the magnetic field distribution measured by the meter into a function.

In such a battery identification system, the amount of data in the reference data can be reduced.

[10]

The battery identification system according to any one of [1] to [9], wherein each battery cell of the plurality of battery cells has a first end surface and a second end surface located on an opposite side of the first end surface, and has, within the each battery cell, a positive current collector disposed on the side of the first end surface and a negative current collector disposed on the side of the second end surface, and the meter is configured to measure the magnetic field distribution on the outer surface with the sensing surface facing any one of the first and second end surfaces of at least one battery cell of the plurality of battery cells.

In such a battery identification system, the magnetic field distribution in which difference in the shapes, sizes, or positions of current collectors is reflected is measured, thus further improving accuracy in identifying the type of the battery.

[11]

The battery identification system according to [10], wherein the reference data is data that indicates a magnetic field distribution on an outer surface of an actual battery product, as the reference magnetic field distribution, the battery product includes a battery cell having at least one soft magnetic material with a specified magnetic susceptibility, as a battery cell corresponding to the at least one battery cell, and the computer is configured to determine whether the type of the battery matches the battery product by comparing the magnetic field distribution measured by the meter with the reference magnetic field distribution, and output a result of determination, as the battery information.

In such a battery identification system, the more characteristic magnetic field distribution can be obtained, thus even more improving accuracy in identifying the type of the battery.

[12]

The battery identification system according to any one of [1] to [11], wherein the battery further includes a ferromagnetic frame or case that integrates the plurality of battery cells, the reference data is data that indicates a magnetic field distribution on an outer surface of an actual battery product, as the reference magnetic field distribution, the battery product includes a frame or case magnetized in a specified pattern, as a frame or case corresponding to the frame or case, and the computer is configured to determine whether the type of the battery matches the battery product by comparing the magnetic field distribution measured by the meter with the reference magnetic field distribution, and output a result of determination, as the battery information.

In such a battery identification system, the more characteristic magnetic field distribution can be obtained, thus even more improving accuracy in identifying the type of the battery.

[13]

A battery identification method including:

measuring, by a meter, a magnetic field distribution on an outer surface of a battery, using a plurality of magnetic elements arranged in or on a sensing surface of a sensor, with the sensing surface facing the outer surface of the battery, which includes a plurality of battery cells electrically connected to each other;

identifying, by a computer, the type of the battery by comparing the magnetic field distribution measured by the meter with a reference magnetic field distribution, with reference to reference data indicating the reference magnetic field distribution; and outputting, from the computer, information regarding the identified type of the battery, as battery information.

In such a battery identification method, the type of the battery is identified by physical characteristics that are hard to change since the time of manufacture, thus improving accuracy in identifying the type of the battery.

[14]

A non-transitory computer readable medium storing a battery identification program to cause a computer to execute operations, the operations including:

acquiring measurement data that indicates a magnetic field distribution on an outer surface of a battery, the magnetic field distribution being measured using a plurality of magnetic elements arranged in or on a sensing surface of a sensor with the sensing surface facing the outer surface of the battery, which includes a plurality of battery cells electrically connected to each other;

identifying the type of the battery by comparing the magnetic field distribution on the outer surface with a reference magnetic field distribution, with reference to reference data indicating the reference magnetic field distribution; and outputting information regarding the identified type of the battery, as battery information.

In the battery identification program stored in such a non-transitory computer readable medium, the type of the battery is identified by physical characteristics that are hard to change from the time of manufacture, thus improving accuracy in identifying the type of the battery.

According to the present disclosure, accuracy in identifying the type of the battery is improved.

An embodiment of the present disclosure will be described below with reference to the drawings.

In the drawings, the same or corresponding portions are denoted by the same reference numerals. In the description of the embodiment, descriptions of the same or corresponding portions are omitted or simplified as appropriate.

A configuration of a battery identification system 10 according to this embodiment will be described with reference to FIG. 1.

The battery identification system 10 includes a sensor 20, a meter 30, and a computer 40.

Figure 2:
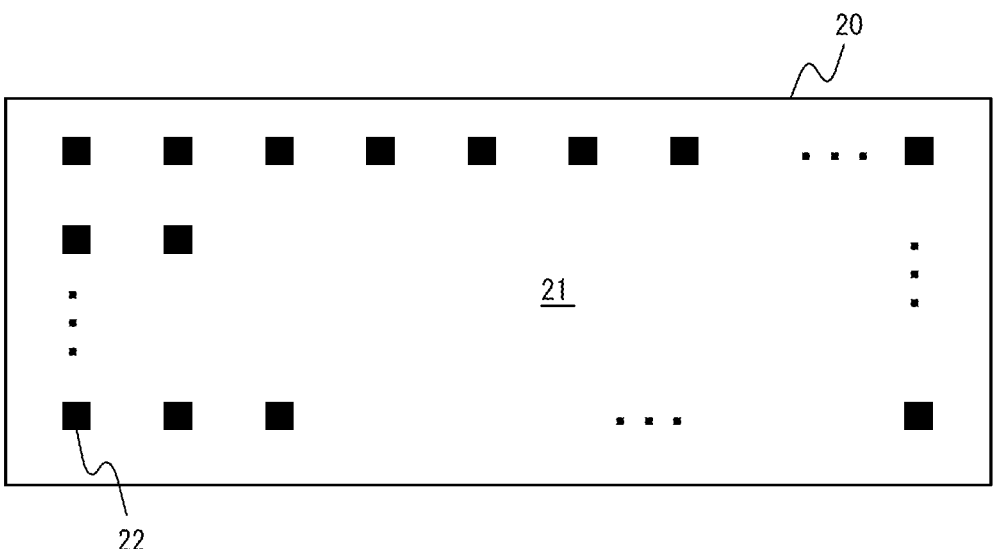
FIG. 2 is a diagram illustrating a configuration of a sensor according to the embodiment of the present disclosure.

The sensor 20 is, for example, a magnetic element array board. As illustrated in FIG. 2, the sensor 20 has a sensing surface 21 and a plurality of magnetic elements 22 arranged in or on the sensing surface 21. The plurality of magnetic elements 22 may be or may not be equally spaced. Each magnetic element 22 may have a single axis or three axes. Each magnetic element 22 may be an analog or digital element. Each magnetic element 22 is, for example, a Hall element or a magneto-resistive element.

The meter 30 is connected to the sensor 20 via a cable or network or wirelessly in this embodiment, but may be integrated with the sensor 20. The meter 30 is, for example, a control board that controls collection of measurement values to measure a magnetic field distribution using the plurality of magnetic elements 22. The meter 30 measures, using the plurality of magnetic elements 22, a magnetic field distribution on an outer surface 51 of a battery 50 with the sensing surface 21 facing the outer surface 51 of the battery 50, which includes a plurality of battery cells 52 electrically connected to each other. Specifically, the meter 30 measures the magnetic field distribution on the outer surface 51 with the sensing surface 21 facing the outer surface 51 so that the plurality of magnetic elements 22 is aligned along an end surface 53 of at least one battery cell 52 of the plurality of battery cells 52. For example, the meter 30 measures the magnetic field distribution on the outer surface 51 with the sensing surface 21 facing the entirety of the end surface 53 of the leftmost battery cell 52, of the six battery cells 52 illustrated in FIG. 1, so that the plurality of magnetic elements 22 is aligned in at least one column along an X-axis direction. The meter 30 outputs data indicating the measured magnetic field distribution on the outer surface 51, as measurement data 11.

In this embodiment, each battery cell 52 has a first end surface and a second end surface located on an opposite side of the first end surface. Each battery cell 52 also has, within each battery cell 52, a positive current collector disposed on the side of the first end surface and a negative current collector disposed on the side of the second end surface. The meter 30 measures the magnetic field distribution on the outer surface 51 with the sensing surface 21 facing any one of the first and second end surfaces of at least one battery cell 52 of the plurality of battery cells 52. For example, the meter 30 measures the magnetic field distribution on the outer surface 51 with the sensing surface 21 facing the entirety of one end surface 53 of both end surfaces in a Z-axis direction, of the leftmost battery cell 52 of the six battery cells 52 illustrated in FIG. 1.

In this embodiment, the sensor 20 is moved along a direction in which the plurality of battery cells 52 is aligned when the meter 30 measures the magnetic field distribution on the outer surface 51. For example, the plurality of battery cells 52 is secured, and the sensor 20 is moved by a stage in the direction of the arrow illustrated in FIG. 1. Therefore, even when the sensing surface 21 is not large in width dimension, a wide range of magnetic field distribution can be measured. A measurement range may cover the end surfaces 53 of all the battery cells 52 or the end surfaces 53 of some of the battery cells 52.

The computer 40 is connected to the meter 30 via a cable or network or wirelessly. The computer 40 is, for example, a general purpose computer such as a PC, a server computer such as a cloud server, or a dedicated computer. The term "PC" is an abbreviation of personal computer. The computer 40 acquires the measurement data 11 output from the meter 30, and also acquires reference data 12 that is stored internally in advance or stored in an external storage in advance. The reference data 12 is data indicating a reference magnetic field distribution. The computer 40 identifies the type of the battery 50 by comparing the magnetic field distribution on the outer surface 51 with the reference magnetic field distribution, with reference to the measurement data 11 and the reference data 12. The computer 40 outputs information regarding the identified type of the battery 50, as battery information 13.

The battery 50 is an assembled battery, in which a plurality of single cells is combined into a single battery, and is used as a secondary battery for driving xEVs such as BEVs, HEVs, or PHEVs, for example. The term "BEV" is an abbreviation of battery electric vehicle. The term "HEV" is an abbreviation of hybrid electric vehicle. The term "PHEV" is an abbreviation of plug-in hybrid electric vehicle. The computer 40 identifies, for example, the authenticity of the assembled battery, as the type of the battery 50.

Since secondary batteries installed in xEVs account for the majority of vehicle body cost, there is a risk that the secondary batteries may be replaced by non-genuine batteries of inferior quality that pose safety issues. In order to quickly recognize such a situation, in this embodiment, the type of an in-vehicle secondary battery can be identified to determine the authenticity thereof.

The replacement by the non-genuine batteries not only causes safety issues, but also leads to financial loss for battery owners. This is because the secondary batteries installed in the xEVs have large capacities and high values as batteries, and use large amounts of rare elements, such as cobalt (Co), nickel (Ni), or lithium (Li). Therefore, the secondary batteries installed in the xEVs are not disposed of as is after use in the xEVs, but are reused in other xEVs or reused for other purposes, for example, as stationary batteries, depending on remaining capacities. When the capacities of the secondary batteries decrease to a point at which the secondary batteries can no longer be used as batteries, the secondary batteries are recycled as raw materials, and resources are recovered.

It is common for the in-vehicle secondary batteries to be provided with identification elements, such as two-dimensional codes or identification chips. However, when only valuable battery cells are extracted and replaced by inferior battery cells, or when the identification elements are imitated, correct identification is impossible. Although it is conceivable to identify batteries by acquiring electrochemical characteristics, such as charge and discharge characteristics of the batteries, the batteries deteriorate over time and the electrochemical characteristics change, and the changes vary from individual to individual. Therefore, using the electrochemical characteristics for identification during or after use may not correctly identify the batteries and may lead to misidentification. As countermeasures against the replacement are taken, the contamination of more sophisticatedly imitated non-genuine products increases, and more accurate identification becomes necessary.

An object of identification in this embodiment is an assembled battery, battery module, or battery pack in which a plurality of battery single cells is regularly aligned, secured, and electrically connected into a single battery. In particular, an assembled battery with rectangular battery cells, inside each of which there are metal current collectors for positive and negative electrodes, is suitable.

The battery identification system 10 acquires, using the plurality of magnetic elements 22, a leakage magnetic field distribution around an assembled battery that is in use or after use due to a reduced capacity, and compares the acquired leakage magnetic field distribution with a reference leakage magnetic field distribution of an assembled battery prepared in advance, into which the assembled battery is to be identified, in order to identify whether the assembled battery the magnetic field distribution of which is measured is a genuine product or non-genuine product. The leakage magnetic field distribution around the assembled battery is mainly formed by adding up a plurality of magnetic field distributions that is generated around metal current collectors inside respective single cells by currents flowing through the metal current collectors by reflecting the shapes, sizes, or positions of the metal current collectors. Since the direction of a current corresponds to the direction of a magnetic field, the orientations of the single cells, which may be different from each other or all the same, are reflected in the leakage magnetic field distribution of the assembled battery.

Figure 3:
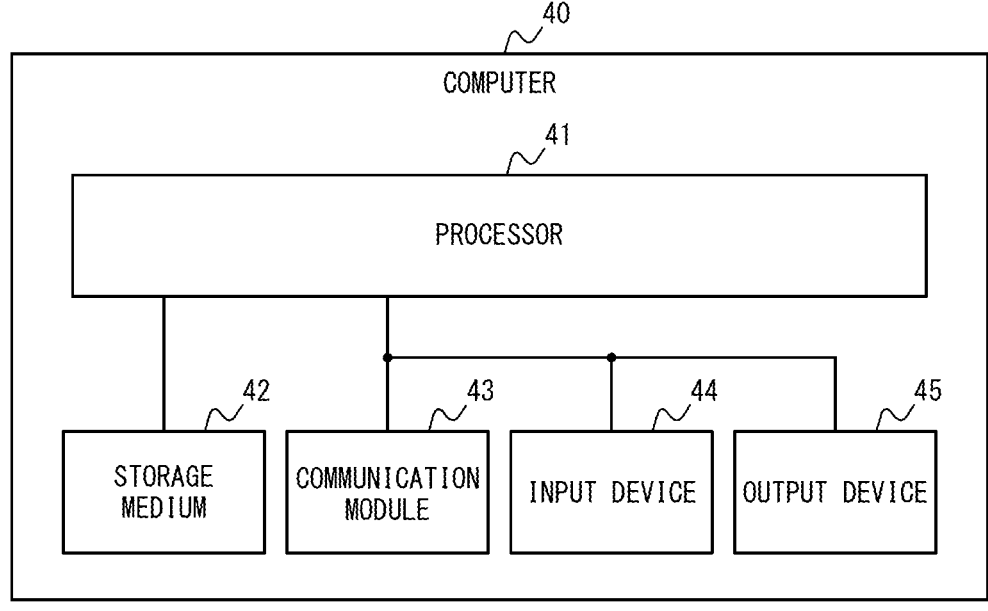
FIG. 3 is a block diagram illustrating a configuration of a computer according to the embodiment of the present disclosure.

The configuration of the computer 40 will be described with reference to FIG. 3.

The computer 40 has a processor 41, a storage medium 42, a communication module 43, an input device 44, and an output device 45.

The processor 41 is a general purpose processor such as a CPU or GPU, or a dedicated processor specialized for particular processing. The term "CPU" is an abbreviation of central processing unit. The term "GPU" is an abbreviation of graphics processing unit. The processor 41 performs processing related to operations of the computer 40 while controlling the various components of the computer 40.

The storage medium 42 includes at least one semiconductor memory, at least one magnetic memory, at least one optical memory, or any combination thereof. The semiconductor memory is, for example, RAM, ROM, or flash memory. The term "RAM" is an abbreviation of random access memory. The term "ROM" is an abbreviation of read only memory. The RAM is, for example, SRAM or DRAM. The term "SRAM" is an abbreviation of static random access memory. The term "DRAM" is an abbreviation of dynamic random access memory. The ROM is, for example, EEPROM. The term "EEPROM" is an abbreviation of electrically erasable programmable read only memory. The flash memory is, for example, SSD. The term "SSD" is an abbreviation of solid-state drive. The magnetic memory is, for example, HDD. The term "HDD" is an abbreviation of hard disk drive. The storage medium 42 functions as, for example, a main memory device, an auxiliary memory device, or a cache memory. The storage medium 42 stores data to be used for the operations of the computer 40 and data obtained by the operations of the computer 40.

The communication module 43 is a module compatible with, for example, a wired LAN communication standard such as Ethernet® (Ethernet is a registered trademark in Japan, other countries, or both) or a wireless LAN communication standard such as IEEE 802.11. The term "LAN" is an abbreviation of local area network. The term "IEEE" is an abbreviation of Institute of Electrical and Electronics Engineers. The communication module 43 communicates with the meter 30. The communication module 43 may also communicate with an external server. The communication module 43 receives data to be used for the operations of the computer 40, and transmits data obtained by the operations of the computer 40.

The input device 44 is, for example, a physical key, a capacitive key, a pointing device, a touch screen integrally provided with a display, a camera, or a microphone. The input device 44 accepts an operation for inputting data to be used for the operations of the computer 40. The input device 44, instead of being included in the computer 40, may be connected to the computer 40 as an external device. As a connection interface, an interface compatible with a standard such as USB, HDMI® (HDMI is a registered trademark in Japan, other countries, or both), or Bluetooth® (Bluetooth is a registered trademark in Japan, other countries, or both) can be used. The term "USB" is an abbreviation of Universal Serial Bus. The term "HDMI®" is an abbreviation of High-Definition Multimedia Interface.

The output device 45 is, for example, a display, a printer, or a speaker. The display is, for example, an LCD or an organic EL display. The term "LCD" is an abbreviation of liquid crystal display. The term "EL" is an abbreviation of electro luminescent. The output device 45 outputs data obtained by the operations of the computer 40. The output device 45, instead of being included in the computer 40, may be connected to the computer 40 as an external device. As an interface for connection, an interface compatible with a standard such as USB, HDMI®, or Bluetooth® can be used.

The functions of the computer 40 are realized by execution of a battery identification program according to this embodiment by the processor 41. In other words, the functions of the computer 40 are realized by software. The battery identification program causes a computer to execute the operations of the computer 40, thereby causing the computer to function as the computer 40. In other words, the computer executes the operations of the computer 40 in accordance with the battery identification program to thereby function as the computer 40.

The program can be stored on a non-transitory computer readable medium. The non-transitory computer readable medium is, for example, flash memory, a magnetic recording device, an optical disc, a magneto-optical recording medium, or ROM. The program is distributed, for example, by selling, transferring, or lending a portable medium such as an SD card, a DVD, or a CD-ROM on which the program is stored. The term "SD" is an abbreviation of Secure Digital. The term "DVD" is an abbreviation of digital versatile disc. The term "CD-ROM" is an abbreviation of compact disc read only memory. The program may be distributed by storing the program in a storage of a server and transferring the program from the server to another computer. The program may be provided as a program product.

For example, the computer temporarily stores, in a main memory, a program stored in a portable medium or a program transferred from a server. Then, the computer reads the program stored in the main memory using a processor, and executes processing in accordance with the read program using the processor. The computer may read a program directly from the portable medium, and execute processing in accordance with the program. The computer may, each time a program is transferred from the server to the computer, sequentially execute processing in accordance with the received program. Instead of transferring a program from the server to the computer, processing may be executed by a so-called ASP type service that realizes functions only by execution instructions and result acquisitions. The term "ASP" is an abbreviation of application service provider. Programs encompass information that is to be used for processing by an electronic computer and is thus equivalent to a program. For example, data that is not a direct command to a computer but has a property that regulates processing of the computer is "equivalent to a program" in this context.

Some or all of the functions of the computer 40 may be realized by a programmable circuit or a dedicated circuit, instead of the processor 41. In other words, some or all of the functions of the computer 40 may be realized by hardware. The programmable circuit is, for example, an FPGA. The term of "FPGA" is an abbreviation of field-programmable gate array. The dedicated circuit is, for example, an ASIC. The term "ASIC" is an abbreviation of application specific integrated circuit.

Operations of the battery identification system 10 according to this embodiment will be described with reference to FIG. 4. These operations correspond to a battery identification method according to this embodiment.

Figure 5:
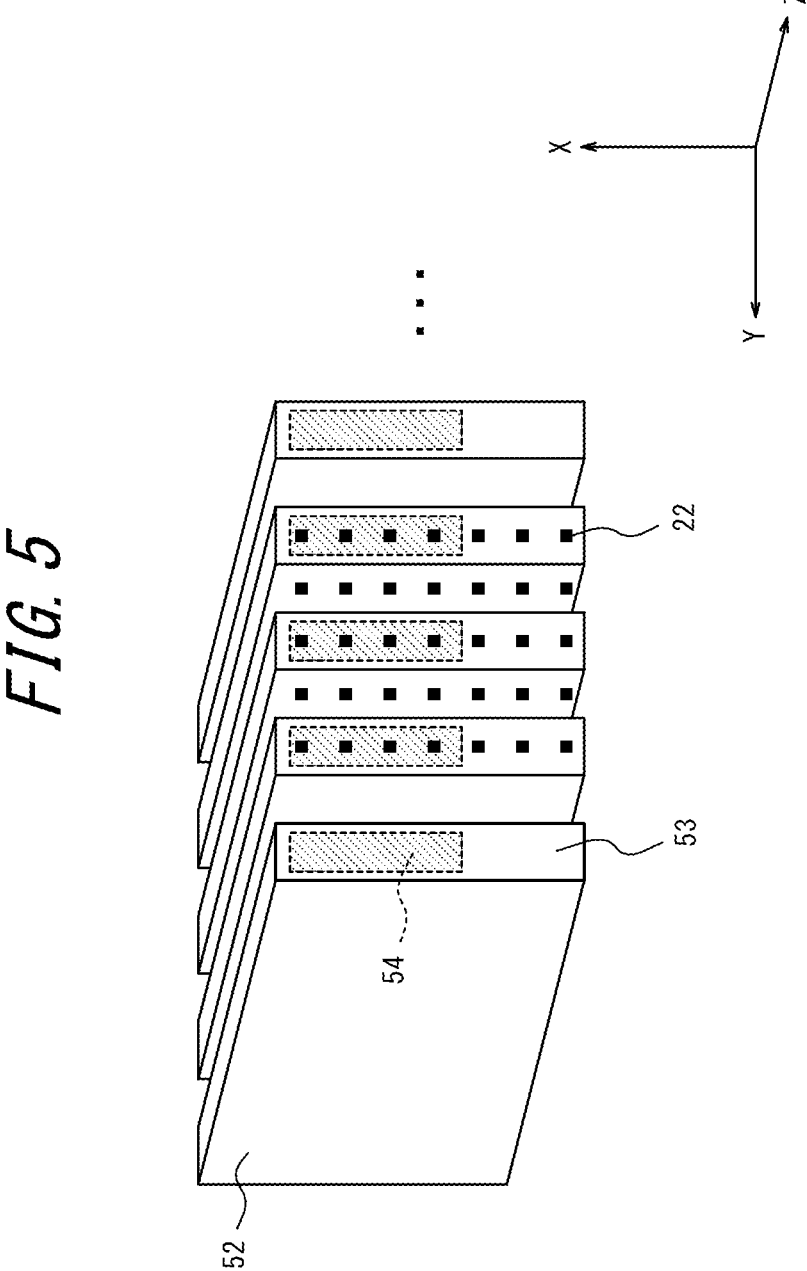
FIG. 5 is a diagram illustrating an example of an arrangement of magnetic elements according to the embodiment of the present disclosure relative to battery cells.

In step S1, the sensor 20 is disposed so that the sensing surface 21 faces the outer surface 51 of the battery 50. Specifically, the plurality of magnetic elements 22 is arranged so as to face a measurement surface, in which the end surfaces 53 on the same side of the plurality of battery cells 52 are aligned, of the battery 50 to be identified. FIG. 5 illustrates an example of the arrangement of the magnetic elements 22 relative to the battery cells 52.

In the example illustrated in FIG. 5, first, as the plurality of magnetic elements 22, seven magnetic elements 22 aligned in a column along the X-axis direction are arranged so as to be aligned along the end surface 53 of one battery cell 52 of the plurality of battery cells 52. Next, the seven magnetic elements 22 are moved in parallel as the whole sensor 20 along a Y-axis direction, and are arranged so as to be aligned along the end surface 53 of another battery cell 52 of the plurality of battery cells 52. Next, the seven magnetic elements 22 are further moved in parallel as the whole sensor 20 along the Y-axis direction, and are arranged so as to be aligned along the end surface 53 of yet another battery cell 52 of the plurality of battery cells 52. Each magnetic element 22 may have a single axis or three axes. In the case of the single axis, the plurality of magnetic elements 22 is desirably arranged in a direction of an axis across the plurality of battery cells 52, in other words, so that magnetic sensitive surfaces face the Y-axis direction. This is because making the magnetic sensitive surfaces orthogonal to macro currents flowing through current collectors 54, each of which is located on the side of the end surface 53 inside each battery cell 52, facilitates obtaining, in step S2 described below, a magnetic field distribution in which the shapes, sizes, or positions of the current collectors 54 and the orientations of the respective battery cells 52 are more reflected.

In the example illustrated in FIG. 5, four magnetic elements 22 of the seven magnetic elements 22 are arranged in an area in which a current collector 54 of each battery cell 52 is present, and the remaining three magnetic elements 22 are arranged in an area in which the current collector 54 of each battery cell 52 is not present, but the arrangement of the magnetic elements 22 in the X-axis direction is not limited to this. However, it is preferable to arrange the magnetic elements 22 in the area in which the current collector 54 of each battery cell 52 is present, because a magnetic field distribution in which the shape, size, or position of the current collector 54 are more reflected can be obtained in step S2 described later. The more densely the magnetic elements 22 are arranged, the more characteristic magnetic field distribution can be obtained. Specifically, the magnetic elements 22 may be arranged as densely as or denser than the spacing that the X-axis dimension of each battery cell 52 is approximately divided by 10.

In step S2, the meter 30 measures, using the plurality of magnetic elements 22, a magnetic field distribution on the outer surface 51 with the sensing surface 21 facing the outer surface 51 of the battery 50. Specifically, the meter 30 measures, using the plurality of magnetic elements 22, the magnetic field distribution on the measurement surface when each battery cell 52 is charged or discharged by being energized at a constant direct current value. Using as large current as possible allows obtainment of a larger leakage magnetic field, thus improving the identification accuracy in step S4 and beyond, as described below. The meter 30 outputs data that indicates the measured magnetic field distribution on the outer surface 51, as measurement data 11.

In the example illustrated in FIG. 5, the meter 30 first measures, using the respective magnetic elements 22, a magnetic field distribution on the end surface 53 of one battery cell 52 with the seven magnetic elements 22 arranged so as to be aligned along the end surface 53 of the battery cell 52. Next, the meter 30 measures, using the respective magnetic elements 22, a magnetic field distribution of the end surface 53 of another battery cell 52 with the seven magnetic elements 22 moved in parallel along the Y-axis direction and arranged so as to be aligned along the end surface 53 of the other battery cell 52. Next, the meter 30 measures, using the respective magnetic elements 22, a magnetic field distribution of the end surface 53 of yet another battery cell 52 with the seven magnetic elements 22 moved in parallel along the Y-axis direction and arranged so as to be aligned along the end surface 53 of the yet other battery cell 52. As a result, seven magnetic field measurement values can be obtained at least three times, in other words, magnetic field measurement values measured at least 21 different positions can be obtained. The meter 30 outputs data including these magnetic field measurement values, as the measurement data 11.

In the example illustrated in FIG. 5, the meter 30 measures the magnetic field distributions on the end surfaces 53 of at least three battery cells 52 with the seven magnetic elements 22, which are aligned along the X-axis direction, arranged so as to be aligned along the Y-axis centerline of the end surface 53 of each of the three battery cells 52, but the arrangement of each magnetic element 22 during the measurement of the magnetic field distributions is not limited to this. For example, the meter 30 may measure the magnetic field distributions of the end surfaces 53 of at least three battery cells 52 with the seven magnetic elements 22 arranged so as to be off the Y-axis centerline of the end surface 53 of each of the three battery cells 52.

In the example illustrated in FIG. 5, the magnetic field distributions of the end surfaces 53 of at least three battery cells 52 adjacent to each other is measured, but the measurement intervals in the Y-axis direction are not limited to these. The measurement intervals may or may not be equally spaced. For example, the measurement intervals may be every other cell, or only at predetermined cells among the plurality of cells. However, it is preferable to make the measurement intervals the same as or denser than the spacing of the arrangement of the cells, and to match measurement intervals to the period of the cells regularly aligned along the Y-axis direction, in order to obtain a more characteristic magnetic field distribution.

In step S3, the processor 41 of the computer 40 acquires the measurement data 11 output in step S2 from the meter 30 via the communication module 43 of the computer 40. The processor 41 of the computer 40, with reference to the measurement data 11, weights each magnetic field measurement value, which is included in the magnetic field distribution of the outer surface 51 measured by the meter 30, according to the position at which each magnetic field measurement value has been measured. Specifically, the processor 41 of the computer 40 performs a weighting process on each magnetic field measurement value according to the measurement position so as to further emphasize the orientations of the battery cells 52 and the shape, size, or position characteristics of the current collectors 54 in the magnetic field distributions measured in step S2. The weighting process may be performed on measured raw values or on normalized values. Normalization is performed in such a method as to leave the signs of the measurement values in order to preserve vector information on a magnetic field in which the orientations of the battery cells 52 are reflected. The normalization allows a comparison to be performed in step S4 independently of a current value that is applied to each battery cell 52 in the magnetic field measurement in step S2. In other words, the current value used in step S2 is preferably always constant. However in a case in which the same current value cannot be used when a reference magnetic field distribution is acquired and when the magnetic field distribution is measured, or even in a case in which there are current fluctuations during measurement, the comparison in step S4 can still be performed.

As a first example of a method of the normalization, when each magnetic element 22 has three axes, a raw magnetic field measurement value in the X-axis direction at a measurement position i is represented by $Bx[i]$, a raw magnetic field measurement value in the Y-axis direction at the measurement position i is represented by $By[i]$, and a raw magnetic field measurement value in the Z-axis direction at the measurement position i is represented by $Bz[i]$. It is conceivable to divide each magnetic field measurement value by the magnitude of a magnetic vector. That is, when $Bmag[i]=\sqrt{(Bx[i]^2+By[i]^2+Bz[i]^2)}$, it is conceivable that a normalized magnetic field measurement value in the X-axis direction at the measurement position i is $Bx[i]/Bmag[i]$, a normalized magnetic field measurement value in the Y-axis direction at the measurement position i is $By[i]/Bmag[i]$, and a normalized magnetic field measurement value in the Z-axis direction at the measurement position i is Bz[i]/Bmag [i]. This method can also absorb a difference between current values used for the measurement.

As a second example of the method of the normalization, when each magnetic element 22 has three axes, a raw magnetic field measurement value in the X-axis direction at a measurement position i is represented by Bx[i], a raw magnetic field measurement value in the Y-axis direction at the measurement position i is represented by By[i], and a raw magnetic field measurement value in the Z-axis direction at the measurement position i is represented by Bz[i]. It is conceivable to divide each magnetic field measurement value by a maximum value of all measurement values of the corresponding magnetic field axis. That is, when a maximum raw magnetic field measurement value in the X-axis direction at all measurement positions is represented by Bx_max, a maximum raw magnetic field measurement value in the Y-axis direction at all the measurement positions is represented by By_max, and a maximum raw magnetic field measurement value in the Z-axis direction at all the measurement positions is represented by Bz_max, it is conceivable that a normalized magnetic field measurement value in the X-axis direction at the measurement position i is Bx[i]/Bx_max, a normalized magnetic field measurement value in the Y-axis direction at the measurement position i is By[i]/By_max, and a normalized magnetic field measurement value in the Z-axis direction at the measurement position i is Bz[i]/Bz_max. This method can also absorb a difference between current values used for the measurement. Instead of the maximum values, other statistical values, such as the minimum values, may be used.

As a weighting method, for example, a method in which a value from 0 to 1 in increments of 0.1 is assigned to each measurement position and a measurement value at each measurement position is multiplied by the assigned value can be used. As an assignment method, for example, a method in which 1 is assigned to a measurement position at the center of the current collector 54 or the center of the battery cell 52 and values are allocated according to the distance from that position can be used.

In step S4, the processor 41 of the computer 40 acquires, as reference data 12, data indicating a reference magnetic field distribution, which is stored in advance in the storage medium 42 of the computer 40. Alternatively, the processor 41 of the computer 40 may acquire, as the reference data 12, data indicating a reference magnetic field distribution, which is stored in advance in an external storage, from an external server via the communication module 43 of the computer 40. For example, to check whether the battery 50 is a genuine secondary battery installed in a particular xEV, the processor 41 of the computer 40 accepts, via the input device 44, an operation to input a vehicle model or vehicle body number, and acquires data corresponding to the input vehicle model or vehicle body number as the reference data 12. Alternatively, for example, when the battery 50 is separated from a vehicle body, the processor 41 of the computer 40 may acquire, as the reference data 12, data corresponding to an identification number read from a two-dimensional code or identification chip attached to the battery 50. With reference to the reference data 12, the processor 41 of the computer 40 compares the magnetic field distribution on the outer surface 51, which includes the magnetic field measurement values weighted in step S3, with the reference magnetic field distribution. The reference magnetic field distribution is subjected to the same weighting process as to the magnetic field distribution on the outer surface 51. As a comparison method, for example, a method of extracting and comparing the amounts of characteristics or a method of imaging the magnetic field distributions and comparing images can be used. Machine learning such as deep learning may be used.

When it is determined in step S4 that the magnetic field distribution on the outer surface 51 is the same as the reference magnetic field distribution, the process of step S5 is executed. On the other hand, when it is determined in step S4 that the magnetic field distribution on the outer surface 51 is not the same as the reference magnetic field distribution, the process of step S6 is executed.

In step S5, the processor 41 of the computer 40 identifies the type of the battery 50 as a desired type. The processor 41 of the computer 40 outputs information regarding the identified type, as battery information 13. Specifically, the processor 41 of the computer 40 determines that the battery 50 is a genuine product, and outputs the determination result as the battery information 13. The processor 41 of the computer 40 may simply output a message that the battery 50 is a genuine product as the battery information 13, or may output the probability that the battery 50 is a genuine product as the battery information 13. For example, the processor 41 of the computer 40 displays, prints, or audio outputs the battery information 13 via the output device 45 of the computer 40. Alternatively, the processor 41 of the computer 40 may provide the battery information 13 to an external server via the communication module 43 of the computer 40.

In step S6, the processor 41 of the computer 40 identifies the type of the battery 50 as a type other than the desired type. The processor 41 of the computer 40 outputs information regarding the identified type, as battery information 13. Specifically, the processor 41 of the computer 40 determines that the battery 50 is a non-genuine product, and outputs the determination result as the battery information 13, as in step S5. The processor 41 of the computer 40 may simply output a message that the battery 50 is a non-genuine product as the battery information 13, or may output the probability that the battery 50 is a non-genuine product as the battery information 13.

As described above, in this embodiment, the plurality of magnetic elements 22 are arranged along the arrangement of the plurality of battery cells 52 included in the battery 50, such as an assembled battery, battery module, or battery pack. The magnetic field distribution around the battery 50 is measured using the arranged plurality of magnetic elements 22. Each measurement value included in the measured magnetic field distribution is weighted according to the measurement position of each measurement value. By comparing the magnetic field distribution including the weighted measurement values with the reference magnetic field distribution prepared in advance, the type of the battery 50 is identified.

The electrochemical characteristics of battery products, which vary from one type of the battery products to another or from one model number of the battery products to another, change and deteriorate over time after manufacture. This degradation process varies even among battery products of the same type or the same model number, depending on a usage history and operating environment. On the other hand, the orientations of the battery cells 52 and the shapes, sizes, and positions of the current collectors 54 inside the battery cells 52, that is, physical characteristics do not change since manufacturing. Therefore, as in this embodiment, the use of the leakage magnetic field distribution around the battery 50 that combines the leakage magnetic field distributions around the battery cells 52, which depend on the orientations of the battery cells 52 and the shapes, sizes, or positions of the current collectors 54, to identify the battery 50 can improve identification accuracy. In particular, the shapes, sizes, or positions of the current collectors 54 vary from one battery maker to another, and therefore are suitable for use in identification.

In this embodiment, the distribution that has been subjected to the weighting process to emphasize the portions of the measured magnetic field distribution in which the orientations of the battery cells 52 and the shapes, sizes, or positions of the current collectors 54 are reflected is compared with the reference magnetic field distribution, so the battery 50 can be identified more accurately. Performing the normalization as a part of the weighting process in such a method as to leave the signs of the measurement values allows the comparison with the reference magnetic field distribution to be made independent of the current values flowing through the battery cells 52 in the measurement of the magnetic fields.

Figure 4:
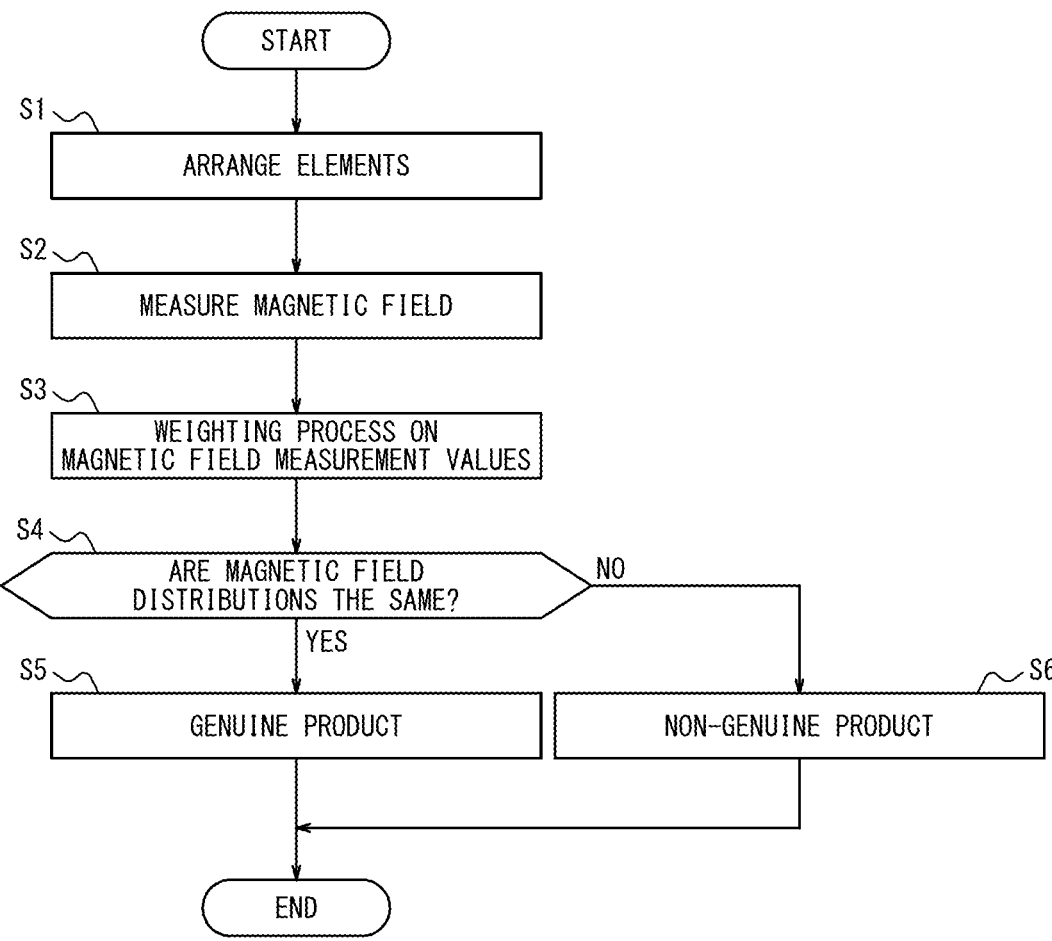
FIG. 4 is a flowchart illustrating operations of the battery identification system according to the embodiment of the present disclosure.

As a variation of the operations illustrated in FIG. 4, the process of step S3 may be omitted. That is, in step S4, the computer 40 may compare the magnetic field distribution on the outer surface 51 with the reference magnetic field distribution, without weighting each magnetic field measurement value included in the magnetic field distribution on the outer surface 51 measured by the meter 30.

Figure 6:
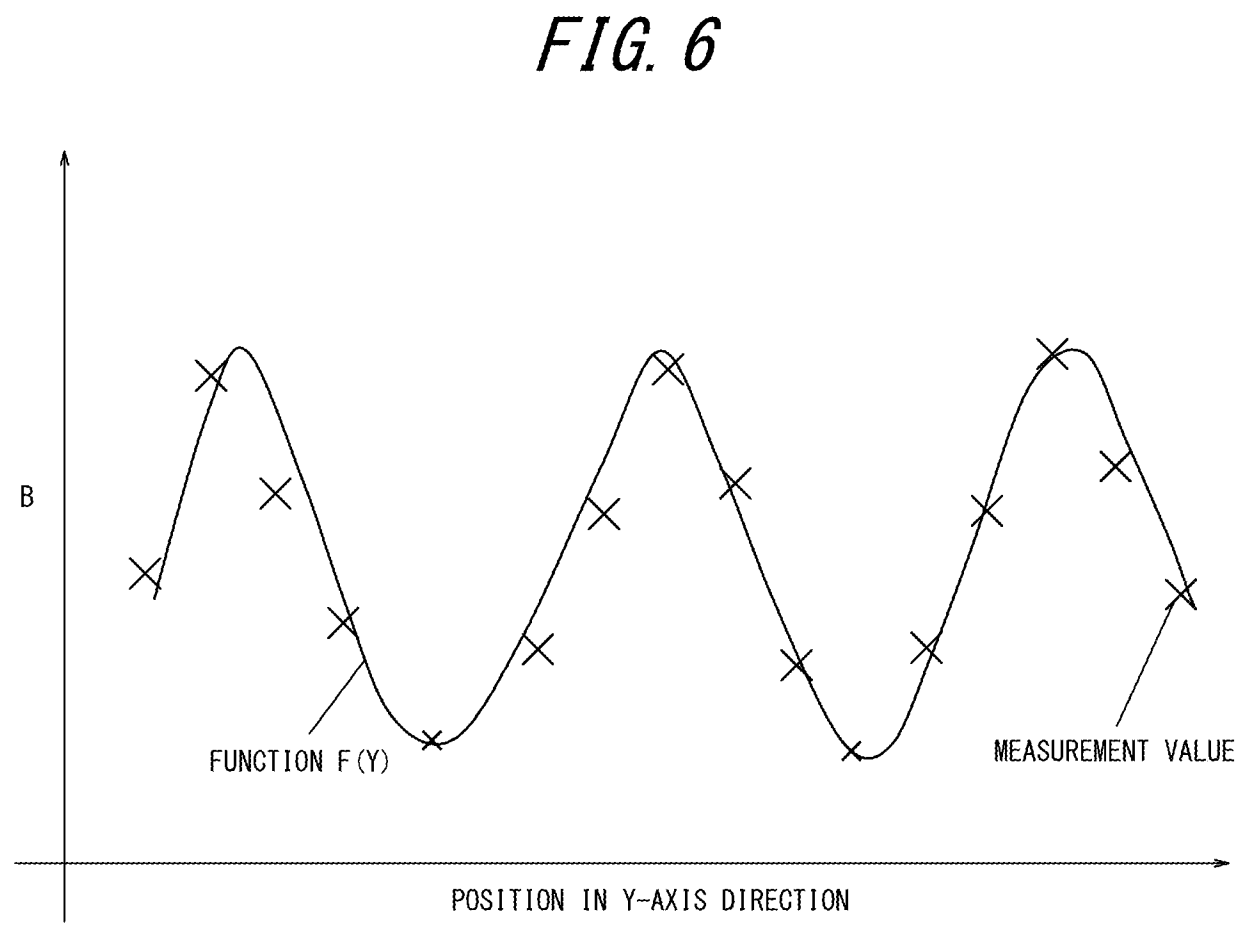

As another variation of the operations illustrated in FIG. 4, the reference data 12 is data that indicates the reference magnetic field distribution as a function. In steps S3 and S4, the computer 40 converts the magnetic field distribution on the outer surface 51 measured by the meter 30 into a function and then compares the magnetic field distribution on the outer surface 51 with the reference magnetic field distribution. FIG. 6 illustrates an example of the conversion of the magnetic field distribution on the outer surface 51 into a function.

In the example illustrated in FIG. 6, the weighting process in step S3 is performed by plotting each measurement value in the Y-axis direction based on the measurement position in the Y-axis direction and defining a function F(Y). For the X-axis direction, a function F(X) may be defined in the same manner. For the Z-axis direction, a function F(Z) may be defined in the same manner. The process in step S4 is comparisons between functions. Therefore, the reference magnetic field distribution is also prepared in advance as functions. The advantage of this example is that the amount of information to be retained as a reference can be compressed, and when measurement position coordinates are specified, a comparison is possible even if the measurement positions cannot be exactly matched between the reference distribution prepared in advance and the distribution measured for identification. For example, by comparing the functions, the battery 50 can be determined as a genuine product when errors are less than a threshold value, and as a non-genuine product when the errors are equal to or more than the threshold value.

In this embodiment, the reference data 12 is data that indicates a magnetic field distribution on an outer surface of an actual battery product, as the reference magnetic field distribution. In step S4, the computer 40 determines whether the type of the battery 50 matches the desired battery product by comparing the magnetic field distribution on the outer surface 51 measured by the meter 30 with the reference magnetic field distribution.

In order to accentuate difference in the magnetic field distributions, at least one soft magnetic material with a specified magnetic susceptibility may be disposed inside at least one of the plurality of battery cells included in the battery product or in an outer can wall thickness. A plurality of soft magnetic materials with different magnetic susceptibilities may be disposed. When the battery 50 to be identified does not include the same soft magnetic material, the magnetic field distribution on the outer surface 51 does not match the reference magnetic field distribution. When the battery 50 is an imitation, misidentification is hard to occur even if the leakage magnetic field distribution, which depends on the orientations of the battery cells 52 and the shapes, sizes, or positions of the current collectors 54, is the same as that of the genuine product.

Figures 7, 8:
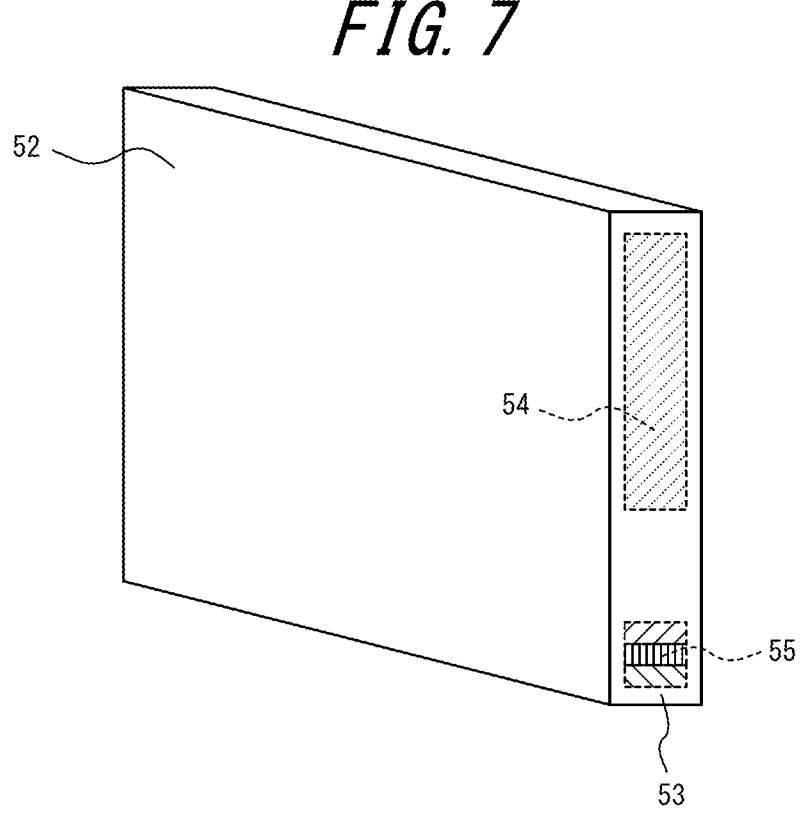
FIG. 7 is a diagram illustrating a variation of a configuration of a battery cell according to the embodiment of the present disclosure.
FIG. 8 is a diagram illustrating a variation of a configuration of a battery according to the embodiment of the present disclosure.

For example, when the battery 50 is a genuine product, as illustrated in FIG. 7, at least one of the plurality of battery cells 52 has a plurality of soft magnetic materials 55, which have different magnetic susceptibilities from each other and each have a specified magnetic susceptibility, in the vicinity of the internal current collector 54. The soft magnetic materials 55 are preferably aligned along the X-axis direction. This is because it is considered easier to obtain a characteristic magnetic field distribution caused by the presence of the plurality of soft magnetic materials 55 along the Y-axis direction in which magnetism flows, which is orthogonal to the X-axis direction in which a current flows. The soft magnetic materials 55 are preferably arranged at a different position from the current collector 54 in the X-axis direction. This is to ensure that a characteristic magnetic field distribution caused by the presence of the current collector 54 and the characteristic magnetic field distribution caused by the presence of the soft magnetic materials 55 do not cancel each other out.

According to the example illustrated in FIG. 7, a more characteristic magnetic field distribution can be obtained by adding the characteristic magnetic field distribution caused by the presence of the soft magnetic materials 55 to the characteristic magnetic field distribution caused by the presence of the current collector 54, thereby improving the identification accuracy. Arranging the plurality of soft magnetic materials 55 with different magnetic susceptibilities, the physical characteristic values of which cannot be visually recognized, inside the single cell also has the effect of making the battery product more difficult to imitate. It is also possible to change the combination of the plurality of soft magnetic materials 55, for example, by a production period or a production lot, in order to make it more difficult to imitate the battery product. Instead of arranging the plurality of soft magnetic materials 55 inside the single cell, arranging a similar plurality of soft magnetic materials in the outer can wall thickness of the single cell can bring about the same effect.

To accentuate a difference in the magnetic field distributions, a ferromagnetic frame or case that integrates the plurality of battery cells included in the battery product may be magnetized in a specified pattern. When the battery 50 to be identified does not include a similar frame or case, the magnetic field distribution on the outer surface 51 does not match the reference magnetic field distribution. When the battery 50 is an imitation, misidentification is hard to occur even if the leakage magnetic field distribution, which depends on the orientations of the battery cells 52 and the shapes, sizes, or positions of the current collectors 54, is the same as that of the genuine product.

For example, when the battery 50 is a genuine product, as illustrated in FIG. 8, the battery 50 includes a steel frame 56 that integrates the plurality of battery cells 52 to ensure strength in securing, electrically connecting, and modularizing or packing the plurality of battery cells 52. The frame 56 is magnetized in a specified pattern before or after modularization or packing. The magnetization pattern is maintained because the frame 56 is ferromagnetic.

According to the example illustrated in FIG. 8, a more characteristic magnetic field distribution can be obtained by adding the characteristic magnetic field distribution caused by the presence of the frame 56 to the characteristic magnetic field distribution caused by the presence of the current collectors 54, thereby improving the identification accuracy. The use of the magnetization pattern, the presence of which cannot be visually recognized, for the identification also has the effect of making the battery product more difficult to imitate. It is also possible to change the magnetization pattern, for example, by a production period or a production lot, in order to make it more difficult to imitate the battery product.

Figure 9:
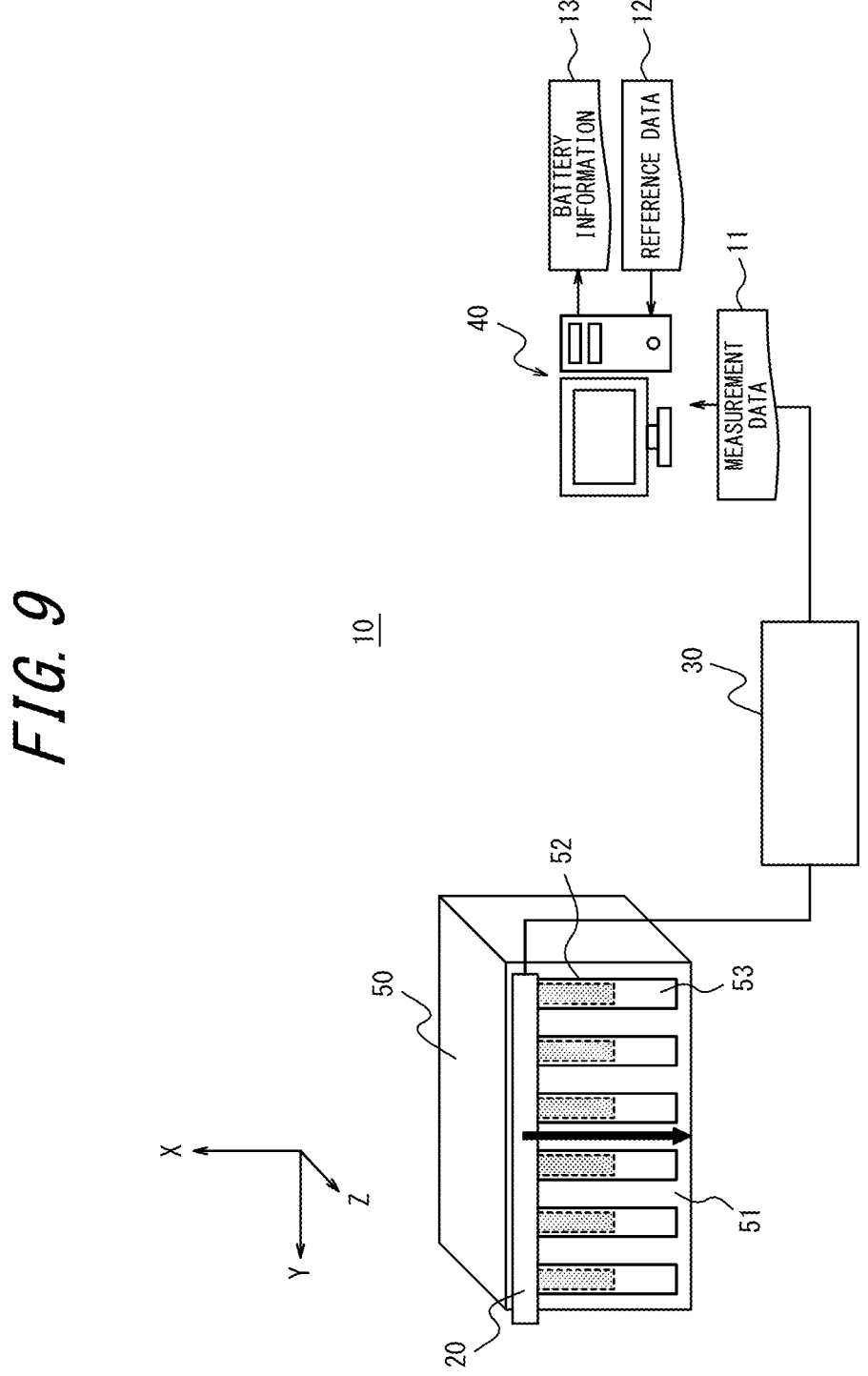
FIG. 9 is a diagram illustrating a variation of the configuration of the battery identification system according to the embodiment of the present disclosure.

As a variation of the configuration of the battery identification system 10, as illustrated in FIG. 9, the meter 30 may measure the magnetic field distribution on the outer surface 51 with the sensing surface 21 facing the outer surface 51 so that the plurality of magnetic elements 22 are aligned across the end surfaces 53 of two or more battery cells 52 of the plurality of battery cells 52. For example, the meter 30 may measure the magnetic field distribution on the outer surface 51 with the sensing surface 21 facing top portions of the end surfaces 53 of all the six battery cells 52 illustrated in FIG. 9 so that the plurality of magnetic elements 22 is aligned in at least one row along the Y-axis direction.

In the example illustrated in FIG. 9, the sensor 20 is moved along a direction orthogonal to a direction in which the plurality of battery cells 52 are aligned when the magnetic field distribution on the outer surface 51 is measured by the meter 30. For example, the plurality of battery cells 52 are secured and the sensor 20 is moved by a stage in the direction of the arrow illustrated in FIG. 9. Therefore, even when the sensing surface 21 is not large in length dimension, a wide range of magnetic field distribution can be measured. A measurement range may cover the end surfaces 53 of all the battery cells 52 or the end surfaces 53 of some of the battery cells 52.

In the example illustrated in FIG. 9, the sensor 20 is moved by the stage so that the six magnetic elements 22 aligned in a row along the Y-axis direction move along the Y-axis centerlines of the end surfaces 53 of the six battery cells 52, but the arrangement of the magnetic elements 22 is not limited to this. For example, the sensor 20 may be moved by the stage so that the six magnetic elements 22 move along lines that are off the Y-axis centerlines of the end surfaces 53 of the six battery cells 52.

In the example illustrated in FIG. 9, the magnetic field distribution on the end surfaces 53 of all the battery cells 52 is measured, but the measurement intervals in the Y-axis direction may be every other cell, or only at predetermined cells among the plurality of cells. In other words, the measurement intervals may or may not be equally spaced. However, it is preferable to make the measurement intervals the same as or denser than the spacing of the arrangement of the cells, and to match the measurement intervals to the period of the cells regularly aligned along the Y-axis direction, in order to obtain a more characteristic magnetic field distribution.

Figure 10:
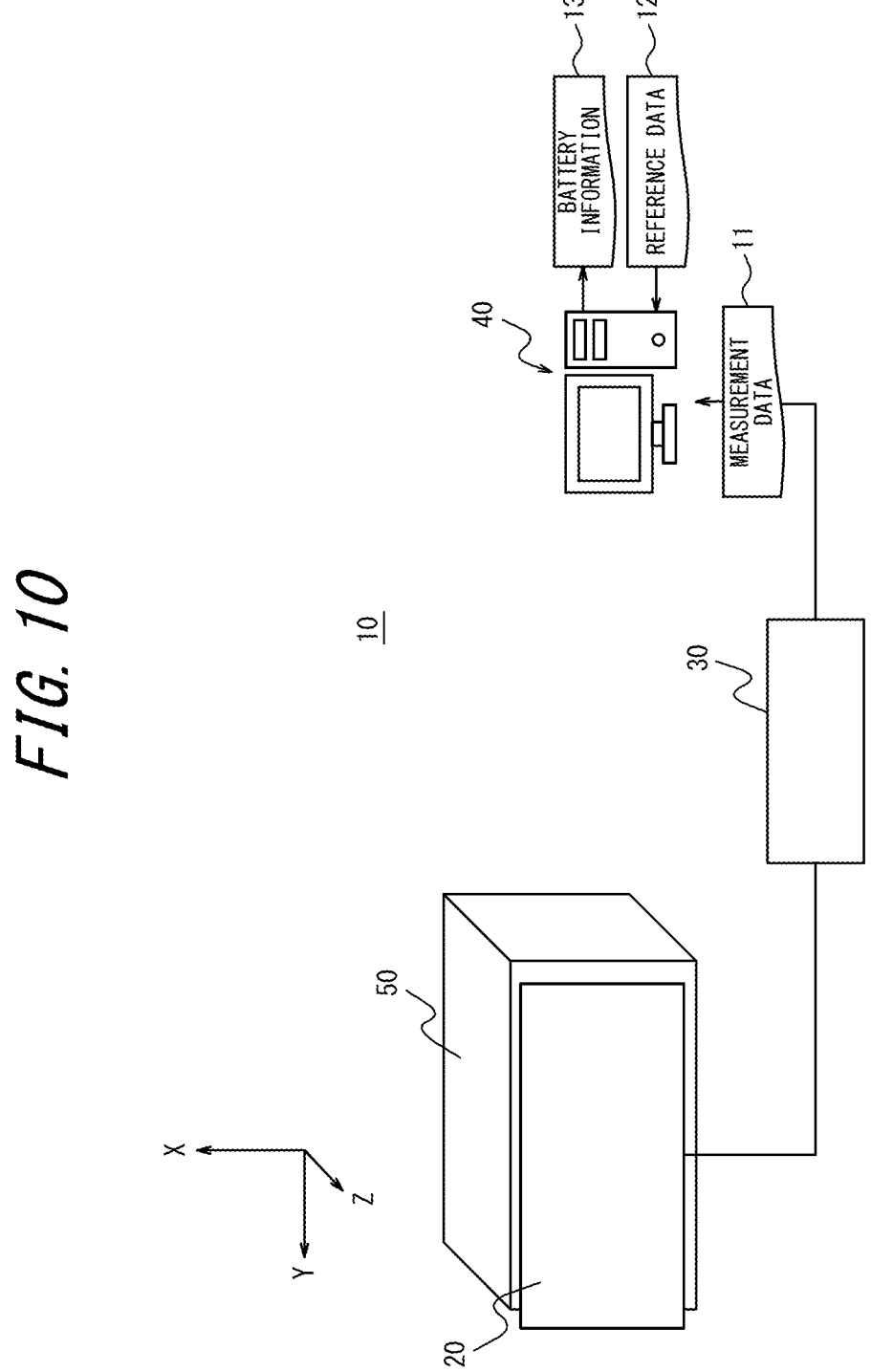
FIG. 10 is another variation of the configuration of the battery identification system according to the embodiment of the present disclosure.

As another variation of the configuration of the battery identification system 10, as illustrated in FIG. 10, the meter 30 may measure the magnetic field distribution on the outer surface 51 with the sensing surface 21 facing the outer surface 51 so that the plurality of magnetic elements 22 are aligned across the end surfaces 53 of two or more battery cells 52 of the plurality of battery cells 52 and so that the plurality of magnetic elements 22 are aligned along the end surface 53 of each of the two or more battery cells 52. For example, the meter 30 may measure the magnetic field distribution on the outer surface 51 with the sensing surface 21 facing the entirety of the end surfaces 53 of all the battery cells 52 so that the plurality of magnetic elements 22 is aligned in a plurality of rows and columns along an XY plane.

In the example illustrated in FIG. 10, when the meter 30 measures the magnetic field distribution on the outer surface 51, the sensor 20 is secured to the battery 50. For example, the sensor 20 is fastened and secured to a frame or case of the battery 50. Alternatively, the battery 50 may be placed on a stand to which the sensor 20 is secured.

In the example illustrated in FIG. 10, the sensor 20 is secured to the battery 50 such that each magnetic element 22 is arranged at the Y-axis center position of the end surface 53 of the corresponding battery cell 52, but the arrangement of each magnetic element 22 is not limited to this. For example, the sensor 20 may be secured to the battery 50 such that each magnetic element 22 is arranged at a position that is off the Y-axis center position of the end surface 53 of the corresponding battery cell 52.

The present disclosure is not limited to the embodiment described above. For example, two or more blocks described in the block diagram may be integrated or one block may be split. Instead of executing two or more steps described in the flowchart in chronological order according to the description, the steps may be executed in parallel or in a different order, depending on the processing capability of the device executing each step or as needed. Other modifications are possible to the extent of not departing from the intent of the present disclosure.

The invention claimed is:

1. A battery identification system comprising:
   a sensor including:
      a board having a sensing surface extending in a first-axis direction and a second-axis direction orthogonal to the first-axis direction; and
      a plurality of magnetic elements arranged, in or on the sensing surface, in at least one row or column along at least one of the first-axis direction and the second-axis direction;
   a meter configured to measure, using the plurality of magnetic elements, a magnetic field distribution on an outer surface of a battery with the sensing surface facing the outer surface along a third-axis direction orthogonal to both the first-axis direction and the second-axis direction, the battery including a plurality of battery cells electrically connected to each other and arranged in the second-axis direction, the outer surface extending in the first-axis direction and the second-axis direction; and
   a computer configured to identify a type of the battery by comparing the magnetic field distribution measured by the meter with a reference magnetic field distribution, with reference to reference data indicating the reference magnetic field distribution, and output information regarding the identified type of the battery, as battery information.

2. The battery identification system according to claim 1, wherein the meter is configured to measure the magnetic field distribution on the outer surface with the sensing surface facing the outer surface so that the plurality of magnetic elements is aligned along an end surface of at least one battery cell of the plurality of battery cells.

3. The battery identification system according to claim 1, wherein the meter is configured to measure the magnetic field distribution on the outer surface with the sensing surface facing the outer surface so that the plurality of magnetic elements is aligned across end surfaces of two or more battery cells of the plurality of battery cells.

4. The battery identification system according to claim 3, wherein the meter is configured to measure the magnetic field distribution on the outer surface with the sensing surface facing the outer surface so that the plurality of magnetic elements is aligned along an end surface of each of the two or more battery cells.

5. The battery identification system according to claim 1, wherein the sensor is configured to be secured to the battery when the meter measures the magnetic field distribution on the outer surface.

6. The battery identification system according to claim 1, wherein the sensor is configured to be moved along the second-axis direction when the meter measures the magnetic field distribution on the outer surface.

7. The battery identification system according to claim 1, wherein the sensor is configured to be moved along the first-axis direction when the meter measures the magnetic field distribution on the outer surface.

8. The battery identification system according to claim 1, wherein the computer is configured to compare the magnetic field distribution measured by the meter with the reference magnetic field distribution, after weighting each magnetic field measurement value included in the magnetic field distribution measured by the meter according to a position at which the each magnetic field measurement value is measured.

9. The battery identification system according to claim 1, wherein the reference data is data that indicates the reference magnetic field distribution as a function, and the computer is configured to compare the magnetic field distribution measured by the meter with the reference magnetic field distribution, after converting the magnetic field distribution measured by the meter into a function.

10. The battery identification system according to claim 1, wherein each battery cell of the plurality of battery cells has a first end surface and a second end surface located on an opposite side of the first end surface, and has, within the each battery cell, a positive current collector disposed on a side of the first end surface and a negative current collector disposed on a side of the second end surface, and the meter is configured to measure the magnetic field distribution on the outer surface with the sensing surface facing any one of the first and second end surfaces of at least one battery cell of the plurality of battery cells.

11. The battery identification system according to claim 10, wherein the reference data is data that indicates a magnetic field distribution on an outer surface of an actual battery product, as the reference magnetic field distribution, at least one soft magnetic material with a specified magnetic susceptibility is disposed inside the battery product so as to affect the magnetic field distribution on the outer surface of the battery product, and the computer is configured to determine whether the type of the battery matches the battery product by comparing the magnetic field distribution measured by the meter with the reference magnetic field distribution, and output a result of determination, as the battery information.

12. The battery identification system according to claim 1, wherein the battery further includes a ferromagnetic frame or case that integrates the plurality of battery cells, the reference data is data that indicates a magnetic field distribution on an outer surface of an actual battery product, as the reference magnetic field distribution, the battery product includes a frame or case magnetized in a specified pattern, as a frame or case corresponding to the ferromagnetic frame or case, and the computer is configured to determine whether the type of the battery matches the battery product by comparing the magnetic field distribution measured by the meter with the reference magnetic field distribution, and output a result of determination, as the battery information.

13. A battery identification method comprising:

measuring, by a meter, a magnetic field distribution on an outer surface of a battery, using a plurality of magnetic elements, with a sensing surface of a board of a sensor facing the outer surface along a third-axis direction orthogonal to both a first-axis direction and a second-axis direction orthogonal to the first-axis direction, the battery including a plurality of battery cells electrically connected to each other and arranged in the second-axis direction, the outer surface extending in the first-axis direction and the second-axis direction, the sensing surface extending in the first-axis direction and the second-axis direction, the plurality of magnetic elements being arranged, in or on the sensing surface, in at least one row or column along at least one of the first-axis direction and the second-axis direction;

identifying, by a computer, a type of the battery by comparing the magnetic field distribution measured by the meter with a reference magnetic field distribution, with reference to reference data indicating the reference magnetic field distribution; and outputting, from the computer, information regarding the identified type of the battery, as battery information.

14. A non-transitory computer readable medium storing a battery identification program to cause a computer to execute operations, the operations comprising:

acquiring measurement data that indicates a magnetic field distribution on an outer surface of a battery, the magnetic field distribution being measured using a plurality of magnetic elements, with a sensing surface of a board of a sensor facing the outer surface along a third-axis direction orthogonal to both a first-axis direction and a second-axis direction orthogonal to the first-axis direction, the battery including a plurality of battery cells electrically connected to each other and arranged in the second-axis direction, the outer surface extending in the first-axis direction and the second-axis direction, the sensing surface extending in the first-axis direction and the second-axis direction, the plurality of magnetic elements being arranged, in or on the sensing surface, in at least one row or column along at least one of the first-axis direction and the second-axis direction;

identifying a type of the battery by comparing the magnetic field distribution on the outer surface with a reference magnetic field distribution, with reference to reference data indicating the reference magnetic field distribution; and outputting information regarding the identified type of the
battery, as battery information.

* * * * *